US006957910B1

(12) United States Patent
Wan et al.

(10) Patent No.: US 6,957,910 B1
(45) Date of Patent: Oct. 25, 2005

(54) SYNCHRONIZED DELTA-VBE MEASUREMENT SYSTEM

(75) Inventors: Jun Wan, Haverhill, MA (US); Peter R. Holloway, Groveland, MA (US); Gary E. Sheehan, Londonderry, NH (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/835,478

(22) Filed: Apr. 28, 2004

Related U.S. Application Data

(60) Provisional application No. 60/534,595, filed on Jan. 5, 2004.

(51) Int. Cl.[7] .......................... G01K 7/01; G01K 7/16; H01L 35/00

(52) U.S. Cl. ..................... 374/183; 374/178; 374/163; 327/512; 702/130

(58) Field of Search ............................... 374/183, 178, 374/163; 327/512, 513; 702/130, 131, 133

(56) References Cited

U.S. PATENT DOCUMENTS 3,872,726 A 3/1975 Kauffeld et al.
3,887,781 A 6/1975 Peters, Jr.
4,243,898 A 1/1981 Seelbach
4,277,975 A 7/1981 Pinkham
4,480,312 A 10/1984 Wingate
4,625,128 A 11/1986 Boeckmann
4,642,785 A 2/1987 Packard et al.
5,053,640 A * 10/1991 Yum .......................... 327/539
5,195,827 A * 3/1993 Audy et al. ................. 374/172
5,257,210 A 10/1993 Schneider et al.
5,469,071 A 11/1995 Obata
5,546,041 A * 8/1996 Szajda ........................ 327/512
5,660,474 A 8/1997 Kurihara
5,829,879 A 11/1998 Sanchez et al.
5,982,221 A * 11/1999 Tuthill ........................ 327/512
5,990,725 A * 11/1999 LoCascio et al. ........... 327/512
6,008,685 A * 12/1999 Kunst ......................... 327/512
6,060,874 A * 5/2000 Doorenbos .................. 323/316
6,078,208 A 6/2000 Nolan et al.
6,097,239 A * 8/2000 Miranda et al. ............ 327/512
6,149,299 A 11/2000 Aslan et al.
6,208,172 B1 3/2001 Evoy et al.
6,271,710 B1 * 8/2001 Ooishi ........................ 327/512
6,363,490 B1 3/2002 Senyk
6,445,244 B1 * 9/2002 Stratakos et al. ........... 327/540
6,501,282 B1 12/2002 Dummermuth et al.
6,545,511 B2 * 4/2003 Rincon-Mora ............... 327/83
6,554,469 B1 4/2003 Thompson et al.
6,629,776 B2 10/2003 Bell et al.

(Continued)

*Primary Examiner*—Gail Verbitsky
(74) *Attorney, Agent, or Firm*—Carmen C. Cook; Patent Law Group LLP

(57) ABSTRACT

A circuit in an integrated circuit for measuring temperature dependent voltages of a temperature sensing element includes a voltage generator circuit providing the temperature dependent voltages, a first sampling switch and a second sampling switch. The voltage generator circuit includes a temperature sensing element being excited by a first switched current and a second switched current. The first and second sampling switches sample a first voltage and a second voltage at the temperature sensing element while the temperature sensing element is being excited by the second current and the first current, respectively. Each of the first and second sampling switches includes a boosted switch circuit incorporating a pedestal voltage compensation circuit. The sampled first and second voltages are coupled to be stored on capacitors external to the integrated circuit. The difference between the first voltage and the second voltage is measured to determine the temperature of the integrated circuit.

27 Claims, 7 Drawing Sheets

U.S. PATENT DOCUMENTS 6,657,476 B1 12/2003 Bicking
6,679,628 B2 * 1/2004 Breinlinger ................. 374/178
6,717,530 B1 * 4/2004 Schmidt et al. ........ 340/870.17
6,736,540 B1 * 5/2004 Sheehan et al. ............ 374/183
6,799,889 B2 * 10/2004 Pennock ..................... 374/178
6,812,722 B2 * 11/2004 Throngnumchai et al. .. 324/760
6,831,504 B1 * 12/2004 Holloway et al. .......... 327/541
6,847,254 B2 * 1/2005 Pai ............................. 327/572
6,869,216 B1 * 3/2005 Holloway et al. .......... 374/170
6,870,421 B2 * 3/2005 Abe ........................... 327/539
2002/0063575 A1 5/2002 Kim et al.
2003/0123520 A1 * 7/2003 Tesi ........................... 374/178

* cited by examiner

50
Delta-VBE Measurement System
100
Delta-VBE Test Circuit 120
110 VBE Generator Circuit
VDD
102
I2=m*I1
I1
CLK3
CLK4
S3
S4
112
+
VBE
–
D1
104
VSS
CLK1
Vg1
S1
Vpch
CLK2
Vg2
S2
Vpcl
114
VBEH
116
VBEL
C1
C2
Delta VBE Meter
V
122

SYNCHRONIZED DELTA-VBE MEASUREMENT SYSTEM

CROSS-REFERENCE TO RELATED APPLICATIONS

This application claims the benefit of U.S. Provisional Patent Application Ser. No. 60/534,595, filed on Jan. 5, 2004, having the same inventorship hereof, which application is incorporated herein by reference in its entirety.

This application is related to copending and commonly assigned U.S. patent application Ser. No. 10/375,297, entitled "Method for synchronized Delta-VBE Measurement for Calculating Die Temperature," of G. Sheehan et al., filed Feb. 26, 2003, which application is incorporated herein by reference in its entirety.

FIELD OF THE INVENTION

The invention relates to a circuit for measuring the temperature of an integrated circuit. In particular, the invention relates to a circuit for synchronously measuring a delta-VBE ($\Delta V_{BE}$) voltage of an on-chip diode to calculate the chip temperature.

DETAILED DESCRIPTION OF THE PREFERRED EMBODIMENTS

Figure 1:
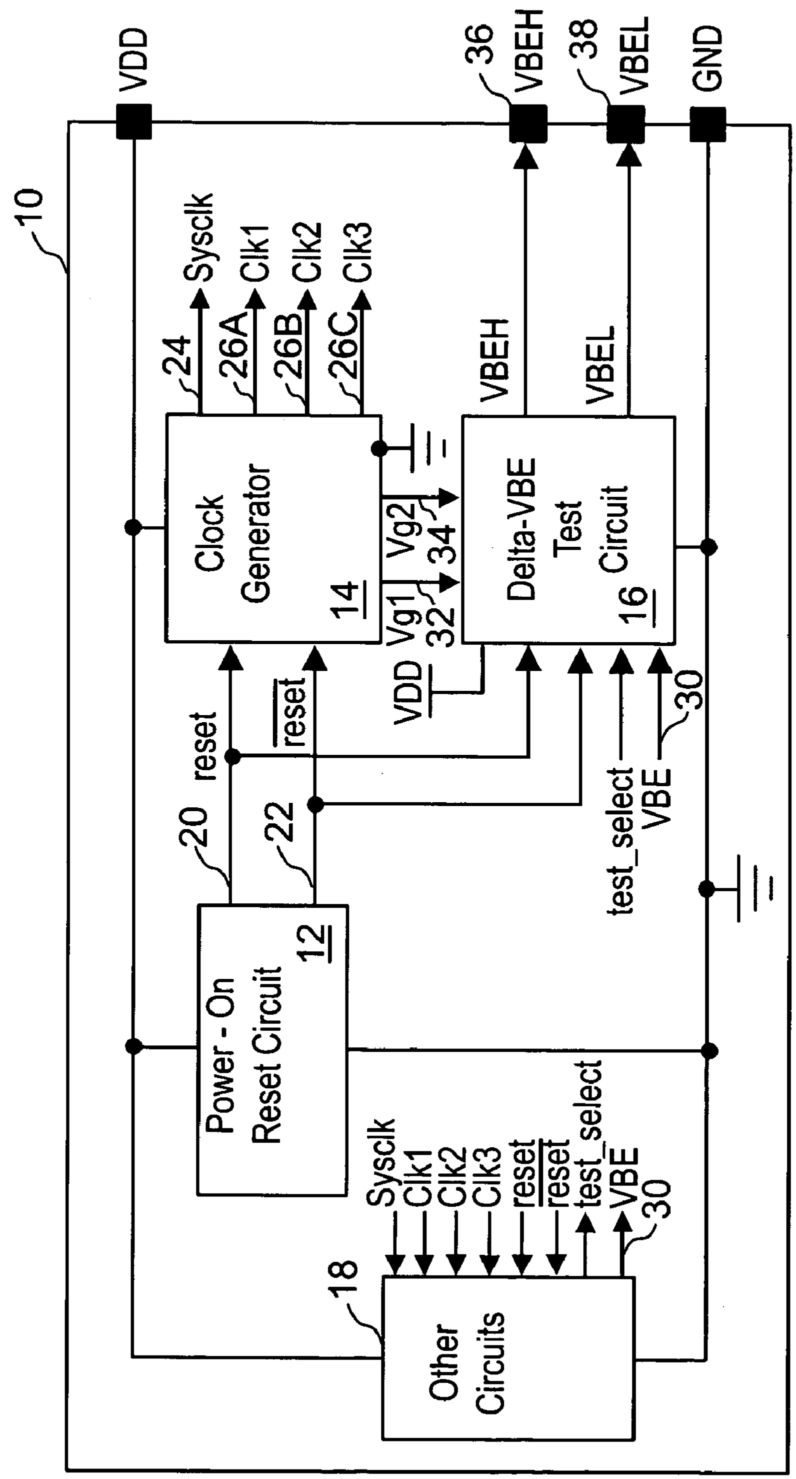
FIG. 1 is a schematic diagram of a digitizing temperature sensor system in which the synchronized delta-VBE measurement system of the present invention can be incorporated.

In accordance with the principles of the present invention, a circuit for synchronously measuring the temperature of an integrated circuit incorporating a temperature sensing element uses a pair of self-bootstrapping constant on-resistance ($R_{ON}$) boosted switch circuits to sample the temperature-dependent voltages of the temperature sensing element. The pair of boosted switch circuits alternately samples the temperature-dependent voltages of the temperature sensing element in synchrony with the temperature sensing element being excited by a first switched current and a second switched current where the first and second switched currents have a fixed ratio. The temperature-dependent voltages are sampled onto a pair of capacitors for filtering and holding of the measured voltages. The measured voltages are indicative of the temperature of the integrated circuit. In one embodiment, the temperature sensing element is an on-chip diode of the integrated circuit and the pair of boosted switch circuits sample the base-to-emitter voltages (VBE) of the on-chip diode for calculating the delta-VBE voltage ($\Delta V_{BE}$) of the diode. The delta-VBE voltage ($\Delta V_{BE}$) of the diode is indicative of the temperature of the integrated circuit.

In one embodiment, each of the pair of boosted switch circuits incorporates a pedestal voltage compensation circuit for reducing voltage measurement errors due to charge injection at the output terminal of the switch circuit. Thus, highly accurate voltage and temperature measurements can be attained using the synchronized delta-VBE measurement system of the present invention.

In operation, the synchronized delta-VBE measurement system samples a first voltage and a second voltage of the temperature sensing element through a first sampling switch and a second sampling switch, respectively, where the first sampling switch and the second sampling switch are each implemented as a boosted switch circuit. The first and second voltages are sampled onto a first capacitor and a second capacitor, respectively. The first and second capacitors are typically external to the integrated circuit in which the synchronized delta-VBE measurement system is incorporated. The operation of the delta-VBE measurement system involves charging the first capacitor through the first sampling switch to the first voltage when the temperature sensing element is being excited by the second switched current and charging the second capacitor through the second sampling switch to the second voltage when the temperature sensing element is being excited by the first switched current. The difference between the first voltage and the second voltage is measured to determine the temperature of the integrated circuit.

In accordance with the present invention, the first sampling switch and the second sampling switch used for sampling the voltages of the temperature sensing element are each implemented as a self-bootstrapping constant on-resistance boosted switch circuit. A self-bootstrapping constant on-resistance "boosted" switch circuit is described in copending and commonly assigned U.S. patent application Ser. No. 10/402,658, entitled "A Constant $R_{ON}$ Switch Circuit with Low Distortion and Reduction of Pedestal Errors," of Peter R. Holloway, filed Mar. 27, 2003, which patent application is incorporated herein by reference in its entirety. When the low distortion switch circuit described in the aforementioned patent application is used to implement the two sampling switches, errors resulting from channel charge feed-through during the switching of the switches are significantly reduced.

Furthermore, in accordance with the present invention, the boosted switch circuit used to implement the sampling switches includes a pedestal voltage compensation circuit implemented as charge scavenging capacitors. The pedestal voltage compensation circuit operates to ensure the desired charge partitioning and charge scavenging so that the injected charge at the output terminal of the main switching device is appropriately canceled. The boosted switch circuit used in the measurement system of the present invention further includes resistors that are strategically placed at the output terminal of the main switching device for ensuring matching of the DC impedance between the two current handling terminals (drain and source) of the main switching device. Finally, the boosted switch circuit incorporates a novel precharge circuit for providing the desired precharge voltage.

Accurate factory trimming of a digital temperature sensor's offset temperature requires highly optimized methodologies. The two basic classes of offset measurement and calibration methods are to measure the temperature surrounding the device or make an independent audit of the on-chip temperature. While each technique has its own merits and demerits, it is generally known that the technique with the most potential accuracy is the on-chip delta-VBE ($\Delta V_{BE}$) measurement method. Almost every other error source can be eliminated or minimized to negligible levels for a single diode temperature sensing system if the two voltage levels, namely the VBEH and VBEL voltages, are measured accurately when the chip is in a factory calibration test mode.

For the purpose of performing on-chip temperature measurement and calibration, the most accurate way currently known to measure on-chip temperature is to have a single diode being excited at two current levels to produce two voltage levels —the VBEH voltage and the VBEL voltage. In practice, the two current levels must have a precise ratio in order to have high accuracy. The temperature dependent behavior of the delta-VBE ($\Delta V_{BE}$) voltage of an on-chip diode is well known and can be expressed as:

$$\Delta VBE=(VBEH-VBEL)=nf^{*}\ kT/q\cdot ln(I_{Hi/ILOW}),$$

wherein $I_{Hi}$ denotes the higher current level applied to the diode and $I_{Low}$ denotes the lower current level applied to the diode.

Copending and commonly assigned U.S. patent application Ser. No. 10/375,297, entitled "Method for synchronized Delta-VBE Measurement for Calculating Die Temperature," of G. Sheehan et al., filed Feb. 26, 2003, which patent application is incorporated herein by reference in its entirety, discloses such a synchronized delta-VBE measurement method whereby a current $I_{Hi}$ and a current $I_{Low}$ are alternately applied to a diode and the VBE voltage generated by the diode at the respective current level is alternately sampled and stored on a respective capacitor. When current $I_{Hi}$ and current $I_{Low}$ alternate at a high clock speed, a synchronous rectifier is needed in order to sample the diode at the correct voltage level. This is accomplished by turning on the sampling switches during the time when the diode has settled to either the VBEH voltage or the VBEL voltage. The sampled voltages are then filtered and held on external capacitors. When the respective VBEH or VBEL voltage at the diode and the respective VBEH or VBEL voltage at the respective capacitor are the same, no net current flows through the sampling switches and the system reaches equilibrium.

FIG. 1 is a schematic diagram of a digitizing temperature sensor system in which the synchronized delta-VBE measurement system of the present invention can be incorporated. In the present illustration, the synchronized delta-VBE measurement system of the present invention is incorporated in a digitizing temperature sensor system 10 for performing temperature offset measurement and calibration of the digitizing temperature sensor system. Digitizing temperature sensor system 10 is built as a single integrated circuit. A temperature sensing element, such as a diode, is built into the integrated circuit for providing temperature measurements. In the present illustration, the temperature sensing diode is included in circuit block 18 and a terminal 30 on circuit block 18 provides the VBE voltage of the temperature sensing diode. In circuit block 18, circuitry is included to provide two excitation currents to the temperature sensing diode for generating a VBEH voltage and a VBEL voltage at the temperature sensing diode. In digitizing temperature sensor system 10, a delta-VBE test circuit 16 is included for synchronously sampling the VBE voltage so as to measure the delta-VBE ($\Delta V_{BE}$) voltage of the on-chip diode. The delta-VBE voltage can then be used to calculate the chip temperature of the integrated circuit. FIG. 1 is illustrative of one application in which the synchronized delta-VBE measurement system can be incorporated. In practice, the synchronized delta-VBE measurement system of the present invention can be used to measure the temperature of any integrated circuit, including but not limited to a digitizing temperature sensor system.

Figure 2:
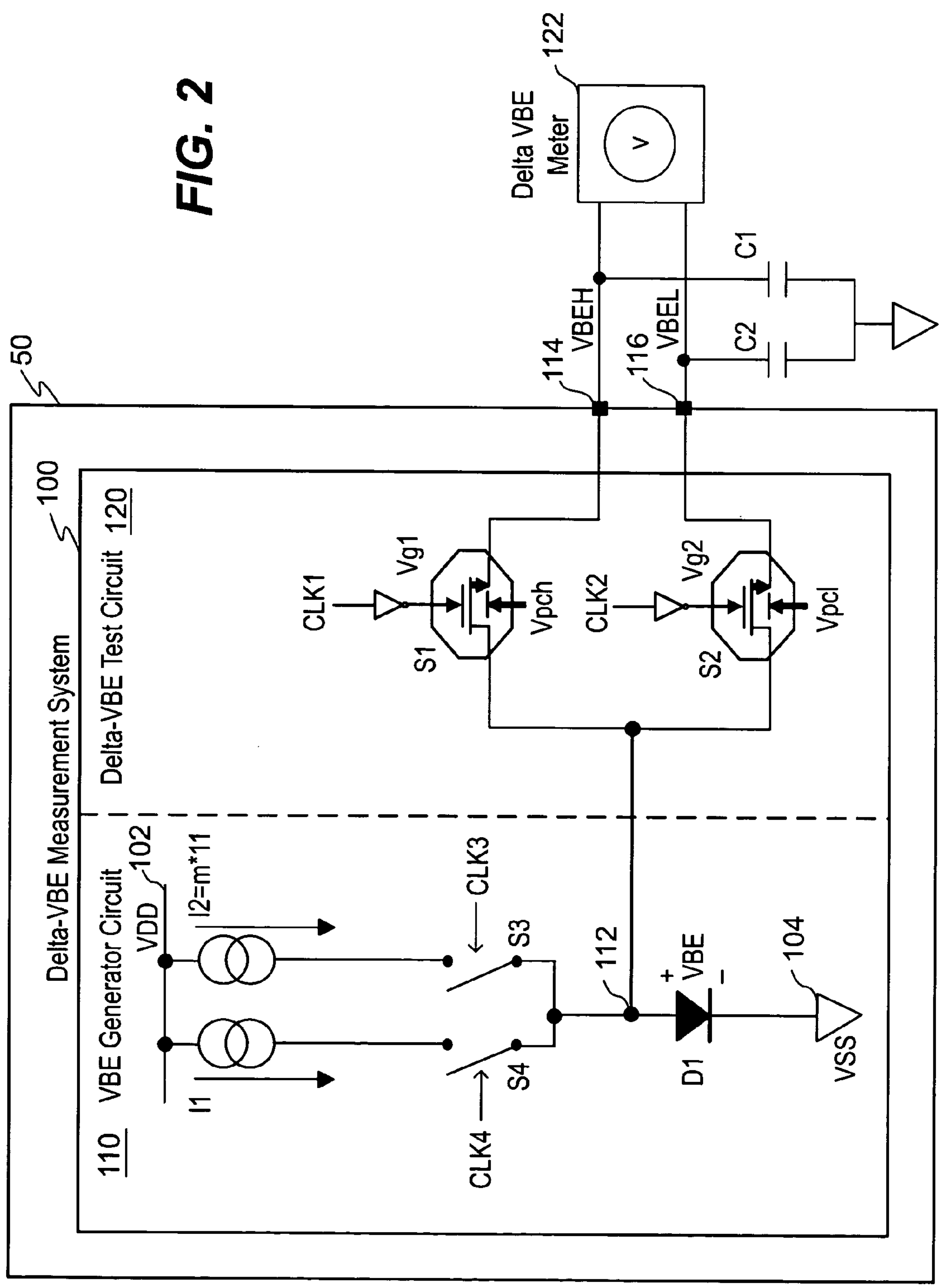
FIG. 2 is a circuit diagram of a synchronized delta-VBE measurement system according to one embodiment of the present invention.

FIG. 2 is a circuit diagram of a synchronized delta-VBE measurement system according to one embodiment of the present invention. Referring to FIG. 2, synchronized delta-VBE measurement system 100 is incorporated in an integrated circuit 50 for measuring the substrate temperature of the integrated circuit. In the present embodiment, synchronized delta-VBE measurement system 100 includes two circuit blocks: a VBE generator circuit 110 for generating a VBE voltage at the two excitation current levels and a delta-VBE test circuit 120 for synchronously sampling the VBE voltage to generate the VBEH and VBEL voltage at the respective excitation current level.

In VBE generator circuit 110, a single diode D1 is used as the temperature sensing element. The diode can be formed as a parasitic vertical PNP bipolar transistor (VPNP) common to virtually all standard CMOS processes. In other embodiments, diode D1 can be formed as a p-n junction diode or a diode-connected bipolar transistor in a process which includes junction isolation for bipolar devices. Diode D1 is excited by two fixed ratio current sources I1 and I2. In the present illustration, current source I2 has a current value m times the current value of current source I1, where m can represent any fixed ratio of known and predictable value and does not have to be an integer. In practice, the current sources are designed with a known fixed ratio value. Any variation of the known fixed ratio value due to the fabrication process is predictable as the variation can be characterized. Current sources I1 and I2 are switchably connected to diode D1 through switches S3 and S4. Switches S3 and S4 are controlled by clock signals CLK3 and CLK4, respectively. Clock signals CLK3 and CLK4 employ a non-overlapping clocking scheme such that only one of switches S3 and S4 is closed at a time.

By the application of the switched currents I1 and I2, a voltage VBE develops at the anode (node 112) of diode D1 where the change in the voltage VBE can be used to derive the substrate temperature sensed by diode D1. Specifically, when current I1 is applied by closing of switch S4, a $V_{BE}$ voltage at the low current level (the VBEL voltage) is developed at node 112 and when current I2 is applied by closing of switch S3, a $V_{BE}$ voltage at the high current level (the VBEH voltage) is developed at node 112. The difference between the VBEL and VBEH voltages is the $\Delta V_{BE}$ voltage for computing the sensed temperature of integrated circuit 50 according to the equation given above.

The VBE voltage generated at node 112 of diode D1 is sampled by delta-VBE test circuit 120 of synchronized delta-VBE measurement system 100. The sampled voltages are coupled to an off-chip measurement circuit for determining the $\Delta V_{BE}$ voltage which is indicative of the sensed temperature. The off-chip measurement method has advantages in that only minimal circuitry is required to be incorporated in integrated circuit 50 to implement the synchronized delta-VBE measurement system of the present invention. Thus, the chip size and cost of the integrated circuit is not significantly increased in order to incorporate the necessary circuitry for practicing the measurement system of the present invention.

Referring to FIG. 2, the VBE voltages at the two current levels are sampled by a first sampling switch S1 and a second sampling switch S2. Switch S1, controlled by a clock signal CLK1, couples the VBE voltage on node 112 to external lead 114 while switch S2, controlled by a clock signal CLK2, couples the VBE voltage on node 112 to external lead 116. In the present embodiment, the main switching devices in sampling switches S1 and S2 are implemented as NMOS transistors while clock signals CLK1 and CLK2 are active low signals. Therefore, the clock signals are inverted before being provided to the respective switches. Specifically, clock signal CLK1 is coupled to an inverter to generate a gate control voltage $V_{g1}$ for controlling switch S1 and clock signal CLK2 is coupled to another inverter to generate a gate control voltage $V_{g2}$ for controlling switch S2. In the present embodiment, clock CLK2 is asserted synchronously with clock CLK4 such that the diode voltage VBEL is provided on lead 116. On the other hand, clock CLK1 is asserted in synchronous with clock CLK3 such that the diode voltage VBEH is provided on lead 114.

External to integrated circuit 50, a first capacitor C1 is coupled between lead 114 and the ground potential and a second capacitor C2 is coupled between lead 116 and the ground potential. Capacitors C1 and C2 function as holding capacitors for sampling and holding the respective VBE voltages from the temperature sensing circuit. Capacitor C1 samples and holds diode voltage VBEH while capacitor C2 samples and holds diode voltage VBEL. Capacitors C1 and C2 can be coupled to a voltmeter 122 for measuring the voltage difference between the diode voltages VBEH and VBEL stored on capacitors C1 and C2 which voltage difference is the temperature-proportional delta-VBE ($\Delta V_{BE}$) voltage. In the present illustration, the voltmeter provides a voltage reading indicative of the $\Delta V_{BE}$ voltage which can be used to compute the sensed temperature of diode D1 as follows.

The relationship between the $\Delta V_{BE}$ voltage of a temperature sensing diode and the applied fixed ratio currents from current sources I1 and I2 is given more accurately as follows:

$$\Delta V_{BE} = \frac{(nf \times k \times T)}{q} \times \ln\left(\frac{I2}{I1}\right),$$

where I1 represents the current value at current source I1, I2 represents the current value at current source I2, T is temperature in degree Kelvin, q is the electronic charge and has a value of $1.602\times10^{-19}$C, and k is the Boltzmann's constant and has a value of $1.38\times\mathbf{10}^{-23}$J/K. nf is the emission coefficient factor where nf is usually close to 1 but not negligibly close to 1. For example, the factor nf can be 1.005. Because current I2 is m*I1, the ratio (12/I1) of the two currents is merely m. When the $\Delta V_{BE}$ voltage is known, the temperature sensed by the diode can be computed as follows:

$$T = \frac{\Delta V_{BE} \times q}{nf \times k \times \ln(m)}.$$

Accordingly, by applying fixed ratio currents to diode D1 and measuring the VBE voltages associated with each current level, the $\Delta V_{BE}$ value can be obtained and the temperature sensed by the diode can be computed.

In the present embodiment, switches S1 and S2 of delta-VBE test circuit 120 are each implemented as a self-bootstrapping constant on-resistance boosted switch circuit ("boosted switch circuit"). The boosted switch circuit operates to reduce charge feed-through at the main switching device that may occur when the switches are being turned off. Accordingly, voltage measurement accuracy can be significantly improved. In FIG. 2, a circuit symbol including a MOS transistor encircled in an octagon is used to denote a boosted switch circuit. In the present embodiment, voltages $V_{g1}$ and $V_{g2}$ are gate control signals controlling the "on" and "off" state of the respective switch circuits. The switch circuits also receive respective precharge voltages Vpch and Vpcl.

The structure and operation of the boosted switch circuit will be described in brief here. Detail circuit construction and operation will be described in more detail below. A boosted switch circuit includes a main switching device (M1), usually a MOS transistor, and a capacitor switchably connected between the gate and source terminals of the main switching device. In the present embodiment, the main switching device is an NMOS transistor. A PMOS transistor can also be used as the main switching device in other embodiments by reversing the polarities of the control voltages. When the switch circuit is turned off, the capacitor is precharged to a reference voltage (the precharge voltage) which is generated by a precharge voltage source. When the switch circuit is turned on, the capacitor is connected between the gate and source terminals of the main switching device so that the precharge voltage is applied as the gate-to-source voltage of the main switching device. The precharge voltage has a magnitude sufficient to compensate for the main switching device's threshold voltage, body effect and to set the overdrive voltage of the main switching device to an exact value equal to a master reference device. This allows for precise control of the "on" resistance of the main switching device so that a constant "on" resistance for a wide range of input voltages can be achieved.

Furthermore, the boosted switch circuit used in the measurement system of the present invention includes a pedestal compensation circuit for canceling injected charge of the main switching device for all process, voltage and temperature conditions. Additionally, impedances on the drain side of the main switching device are used to balance those presented on the source side. By choosing resistors of a desirable temperature coefficient and value, it is possible to keep the channel charge partitioning ratio nearly constant over temperature. In this manner, pedestal voltage error caused by charge injection is minimized for all process, voltage and temperature conditions.

Figure 3:
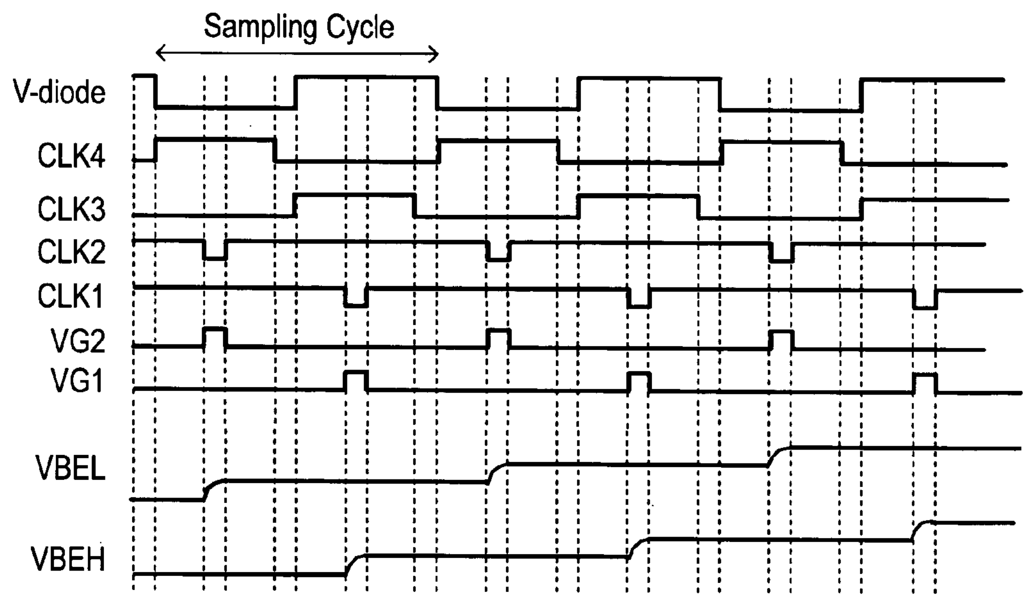
FIG. 3 is a timing diagram illustrating the clocks and the resulting voltages during the operation of the synchronized delta-VBE measurement system of the present invention.

The operation of synchronized delta-VBE measurement system 100 of the present invention will now be described with reference to the timing diagram of FIG. 3. By applying non-overlapping clock signals CLK3 and CLK4, currents 11 and I2 are alternately applied to diode D1. The switched current excitation of diode D1 causes the diode voltage V-diode at node 112 to switch between a first voltage level (settled VBEH) and a second, lower voltage level (settled VBEL). The two voltages are synchronously sampled through switches S1 and S2 to holding capacitors C1 and C2. Specifically, under the control of clock CLK2 which is asserted during the active period of clock CLK4, switch S2 is closed and voltage VBEL is sampled onto capacitor C2. Alternately, under the control of clock CLK1 which is asserted during the active period of clock CLK3, switch S1 is closed and voltage VBEH is sampled onto capacitor C1. Note that in the timing diagram of FIG. 3, clock signals CLK1 and CLK2 are active low signals. Because the sampling switches in the delta-VBE test circuit are based on an NMOS transistor as the main switching device, active high control signals are needed and the clock signals CLK1 and CLK2 need to be inverted into gate control signals $V_{g1}$ and $V_{g2}$ as shown in FIG. 3 for controlling the sampling switches.

In the present illustration, clocks CLK1 and CLK2 are only active for a fraction of the sampling cycle period. With each successive application of excitation currents and sampling of the VBE voltages, capacitors C1 and C2 are gradually charged to the final VBEL and VBEH voltages values. At each sampling of the diode voltage, voltages VBEL and VBEH at capacitors C1 and C2 gradually increase in a step-wise fashion towards the final voltage values, as illustrated in FIG. 3. After an adequate number of sampling cycles, capacitor C1 and capacitor C2 will be charged to their final VBE voltage values. The final VBEH and VBEL voltage values can then be measured by voltmeter 122 to determine the difference in VBE voltages or the $\Delta V_{BE}$ value.

In the present illustration, capacitors external to the integrated circuit of interest are used to store and filter the diode VBE voltages. The external capacitors can be discrete components built on a PC board. In some applications, the synchronized delta-VBE measurement system of the present invention is practiced on an integrated circuit test equipment (a tester) whereby the capacitors can be formed on a test board and the voltmeter is a voltmeter of the tester. Capacitors C1 and C2 can have the same capacitance values or the capacitors can have different capacitance values. In one embodiment, each of capacitors C1 and C2 has a capacitance value of 1 nf. The exact capacitance values of capacitors C1 and C2 are not critical to the practice of the synchronized delta-VBE measurement system of the present invention. The capacitance values affect the time constant to charge the capacitors, the filtering response of the capacitors and the ripple or AC component of the filtered response. Therefore, the capacitance values can be chosen to obtain the desired time constant for charging the capacitors or the desired filtering response. Alternately, the external capacitors can be formed on an integrated circuit separate from the integrated circuit of interest.

In another embodiment, capacitor C2 for capturing the lower VBEL voltage has a smaller capacitance value than capacitor C1 for capturing the higher VBEH voltage. Because capacitor C2 is being charged at a lower current level, a smaller capacitance value decreases the time constant for charging capacitor C2. When capacitors C1 and C2 have equal capacitance values, the VBEL voltage charges at a slower rate because of a larger time constant associated with capacitor C2 being charged at a lower current level. By selecting a smaller capacitance for capacitor C2 than capacitor C1, the time constants for charging the VBEL and VBEH voltages can be made close to each other. Thus, the VBEL and VBEH voltages can be charged at the same rate so that better tracking of the VBEL and VBEH voltages can be achieved.

Figure 4:
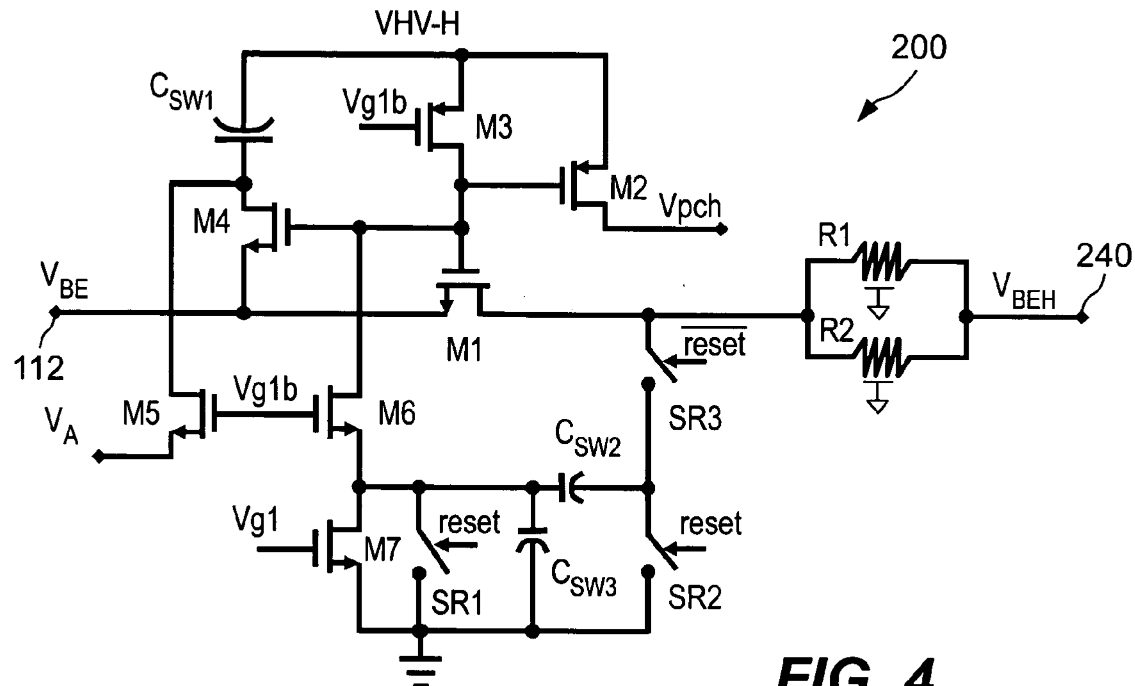
FIG. 4 is a circuit diagram of a boosted switch circuit which can be used to implement sampling switch S1 of the synchronized delta-VBE measurement system according to one embodiment of the present invention.

FIG. 4 is a circuit diagram of a boosted switch circuit which can be used to implement sampling switch S1 of the synchronized delta-VBE measurement system according to one embodiment of the present invention. Referring to FIG. 4, NMOS transistor M1 is the main switching device of boosted switch circuit 200. Transistor M1 is the series boosted switch that samples voltage VBE (node 112) when the VBE voltage is high to provide the VBEH voltage at an output node 240. Output node 240 of switch circuit 200 can be coupled to external lead 114 to provide the VBEH voltage to the external capacitor C1.

Switch circuit 200 further includes a precharge capacitor $C_{SW1}$ switchably connected between the gate and source terminals of transistor M1. Specifically, one terminal of capacitor $C_{SW1}$ is connected to the gate terminal of transistor M1 through a PMOS transistor M3 functioning as a switch. Transistor M3 is controlled by a $V_{g1b}$ signal which is an inverse of gate control signal $V_{g1}$. When transistor M1 is turned off, transistor M3 is also turned off to disconnect capacitor $C_{SW1}$ from the gate terminal of transistor M1 and capacitor $C_{SW1}$ can then be precharged. When transistor M1 is turned on, transistor M3 is turned on also to connect capacitor $C_{SW1}$ to the gate terminal of transistor M1. The other terminal of capacitor $C_{SW1}$ is connected to the source terminal of transistor M1 through an NMOS transistor M4. Transistor M4 is controlled by the gate voltage of transistor M1. When transistor M1 is turned off, the gate voltage is at zero volt and transistor M4 is also turned off. Capacitor $C_{SW1}$ is thus disconnected from the source terminal of transistor M1. When transistor M1 is turned on, the gate voltage is at least at the precharge voltage of precharge capacitor $C_{SW1}$, thus transistor M4 is turned on to connect capacitor $C_{SW1}$ to the source terminal of transistor M1.

Switch circuit 200 also includes a PMOS transistor M2 and an NMOS transistor M5 coupled to precharge capacitor $C_{SW1}$. In the present illustration, switch circuit 200 is used to implement sampling switch S1 of delta-VBE test circuit 120 in FIG. 2 and thus the precharge voltage is the Vpch voltage. Transistor M2 is coupled to the precharge voltage Vpch while transistor M5 is coupled to the precharge voltage $V_A$. The capacitor $C_{SW1}$ is precharged to a voltage value of Vpch-$V_A$. In one embodiment, voltage $V_A$ is the Vss or the ground voltage. Switch circuit 200 includes an NMOS transistor M6 which operates to ground the gate voltage of transistor M1 when transistor M1 is to be turned off.

Switch circuit 200 includes a pedestal voltage compensation circuit formed by an NMOS transistor M7 and a capacitor divider circuit including capacitors $C_{SW2}$ and $C_{SW3}$. Capacitors $C_{SW2}$ and $C_{SW3}$ operate as charge scavenging capacitors for recovering the channel charge from transistor M1 when transistor M1 is turned off to compensate for charge injection at the drain terminal of transistor M1.

When switch circuit 200 is incorporated in the delta-VBE test circuit of the synchronized delta-VBE measurement system of the present invention, it may be desirable or it may be necessary to disable the switch circuit when delta-VBE measurement is not being made. In the present embodiment, switch circuit 200 includes reset switches SR1, SR2 and SR3 for deactivating the switch circuit under the control of a Reset signal and its inverse. Specifically, reset switches SR1, SR2 and SR3 operate to discharge capacitors $C_{SW2}$ and $C_{SW3}$ when the switch circuit is not to be activated. When the switch circuit is to be activated, the Reset signal is deasserted and switches SR1 and SR2 are open to disable the grounding of capacitors $C_{SW2}$ and $C_{SW3}$ while switch SR3 is closed to complete the circuit connection of capacitor $C_{SW2}$ to the drain terminal of transistor M1. The use of reset switches SR1 to SR3 is optional.

When the synchronized delta-VBE measurement system of the present invention is incorporated in the digitizing temperature sensor system of FIG. 1, the Reset signal can be equivalent to the inverse of the test_select signal. When integrated circuit 10 is not in test mode, test_select is not asserted and reset is asserted to disable the delta-VBE test circuit. When test mode is selected, test_select is asserted and reset is deasserted to enable the delta-VBE test circuit.

Returning to FIG. 4, switch circuit 200 further includes a resistor network coupled to the drain terminal of transistor M1. In the present embodiment, the resistor network includes resistors R1 and R2 connected in parallel. The resistor network of resistors R1 and R2 is provided to realize impedance matching of the drain and source terminals of transistor M1. The use of the resistor network and the selection of resistors R1 and R2 will be described in more detail below.

The operation of switch circuit 200 will now be described. When switch circuit 200 is open, capacitor $C_{SW1}$ is precharged to a voltage of $(Vpch-V_A)$. When switch circuit 200 is turned on, capacitor $C_{SW1}$ is connected between the source and gate terminals of transistor M1. Capacitor $C_{SW1}$ retains almost all of its charge and applies a voltage to the gate and source terminals of transistor M1 of: $Vgs=(Vpch-V_A)$. The voltage values for voltages Vpch and $V_A$ are carefully selected to compensate for transistor M1's threshold voltage, $V_{TH}$, which is a function of the source voltage Vs of the transistor which is also a function of the VBE voltage being measured. The voltage values for voltages Vpch and $V_A$ are also selected to set the overdrive of transistor M1 (the Vgt voltage) to an exact value equal to a master reference device. This allows for precise control of transistor M1's on-resistance RON and injected charge $Q_{injected}$ over all variations in process, voltage and temperature conditions.

To eliminate pedestal errors due to charge injection at the drain terminal of transistor M1, switch circuit 200 includes charge scavenging capacitors $C_{SW2}$ and $C_{SW3}$ that form a capacitor divider. When switch circuit 200 is turned off, the gate charge of transistor M1 is directed to and partitioned by the capacitor divider to derive a compensating charge. The compensating charge is redirected to the drain terminal of transistor M1 to cancel the injected charge. Specifically, capacitor $C_{SW2}$ scavenges an appropriate amount of the gate charge of transistor M1 and redirects the compensating charge to the drain terminal of transistor M1. The charge used for compensating the injected charge is derived directly from the channel charge which is extracted through transistor M1's gate by transistor M6. Therefore, charge compensation can be achieved with a high degree of accuracy.

In the present embodiment, capacitors $C_{SW2}$ and $C_{SW3}$ form a capacitor divider circuit to divide the gate charge from transistor M1. The capacitance values of capacitors $C_{SW2}$ and $C_{SW3}$ are selected appropriately so that the right amount of charge is scavenged by capacitor $C_{SW2}$ to compensate for the injected charge. In one embodiment, capacitors $C_{SW2}$ and $C_{SW3}$ have equal capacitance values for equal charge partitioning. In other embodiments, capacitor $C_{SW2}$ has a capacitance value that is ⅔ of the capacitance value of capacitor $C_{SW3}$ so that the scavenged charge for compensation is about 40% of the total channel charge.

Figure 5:
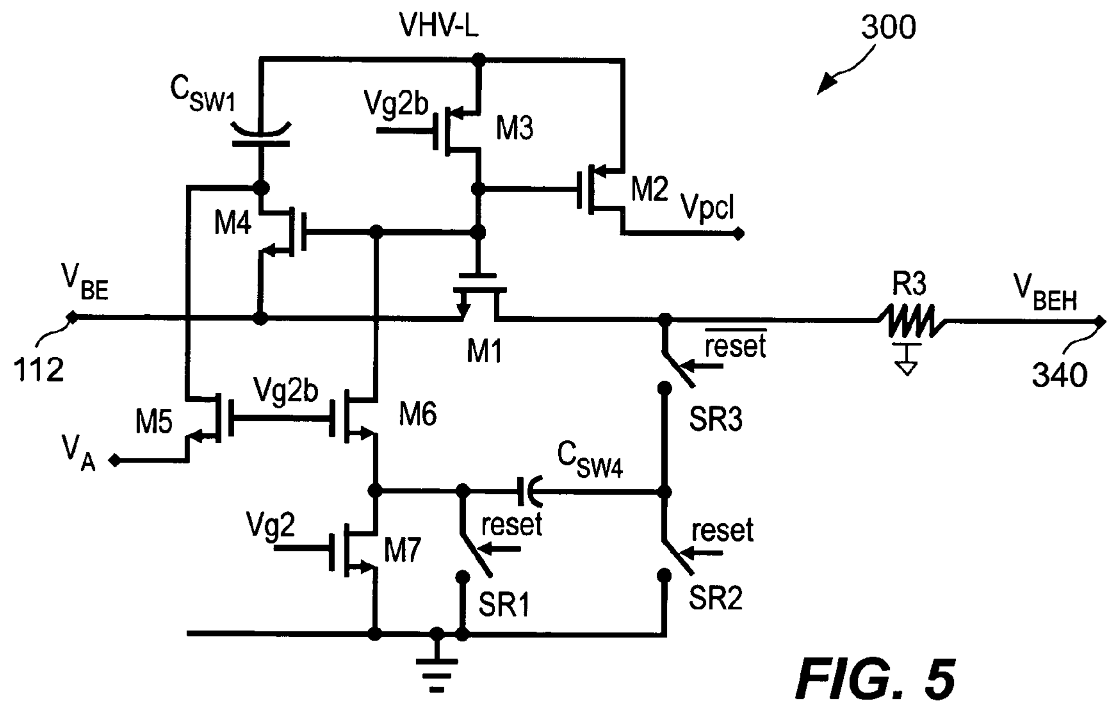
FIG. 5 is a circuit diagram of a boosted switch circuit which can be used to implement sampling switch S2 of the synchronized delta-VBE measurement system according to one embodiment of the present invention.

FIG. 5 is a circuit diagram of a boosted switch circuit which can be used to implement sampling switch S2 of the synchronized delta-VBE measurement system according to one embodiment of the present invention. Switch circuit 300 of FIG. 5 is constructed in the same manner as switch circuit 200 of FIG. 4 with the following exceptions. First, switch circuit 300 is controlled by gate control signal $V_{g2}$ and its inverse. Also, transistor M2 of switch circuit 300 receives the precharge voltage Vpcl when switch circuit 300 is used for implementing sampling switch S2. Second, the resistor network in switch circuit 300 used for impedance matching includes a single resistor R3.

Lastly, referring to FIG. 5, switch circuit 300 includes a pedestal voltage compensation circuit where a single capacitor $C_{SW4}$ is used as the charge scavenging capacitor, instead of a capacitor divider circuit. Capacitor $C_{SW4}$ is coupled between the source terminal of transistor M6 and the drain terminal of transistor M1 (the main switching device). In the present illustration, switch circuit 300 is used to implement sampling switch S2 of delta-VBE test circuit 120 in FIG. 2 for measuring the VBEL voltage. Because of the lower voltage value of the VBEL voltage, it is desirable to use a single capacitor $C_{SW4}$ to scavenge all of the gate charge on transistor M1. For VBEL measurements, the sampled voltages have lower voltage values and virtually all of transistor M1's channel charge preferentially flows out of the drain terminal of transistor M1 into a much higher capacitive load. Furthermore, the drain terminal of transistor M1 sees a much lower instantaneous impedance looking into the parasitic capacitances of resistor R3. Therefore, there is no need to partition the gate charge and all of the available gate charge from transistor M1 is used for compensation. Thus, in switch circuit 300 of FIG. 5, a single capacitor $C_{SW4}$ is used alone to scavenge the gate charge and no capacitor divider is formed to partition the gate charge.

As described above, switch circuit 200 of FIG. 4 and switch circuit 300 of FIG. 5 each includes a resistor network for implementing impedance matching between the drain and source terminals of the main switching device (transistor M1). To improve the accuracy of the pedestal error voltage compensation, there is a need to balance the impedances on the drain side to the impedances presented on the source side of transistor M1 since the charge partitioning ratio is directly affected by the impedances at source and drain terminals. In switch circuits 200 and 300 of FIGS. 4 and 5, one or more resistors are coupled to the drain terminal of transistor M1 to implement impedance matching. Resistors of a desirable temperature coefficient and value are chosen in order to ensure that the channel charge partitioning ratio is nearly constant over temperature.

Specifically, the source terminal of transistor M1 is connected to the VBE node which is the anode of the temperature sensing diode. The diode has an impedance that is a function of the excitation current and temperature. For VBEL measurement, the source impedance is much higher and for VBEH measurement, the source impedance is much lower. To achieve perfect symmetry so as to cancel all components of injected charge errors, the DC impedance of the drain side of the main switching device should be matched to the source side of the main switching device to improve scavenging of the gate charge.

In FIG. 4, when switch circuit 200 is used for VBEH measurement, resistors R1 and R2, connected in parallel, are inserted between the drain terminal of transistor M1 and the VBEH output voltage node 240. The resistors have different temperature coefficients to balance the temperature coefficients of the total effective resistance so as to make the resistors' temperature coefficients track the temperature coefficient of the sensing diode. In one embodiment, the ratio of the impedances on the drain and source sides of transistor M1 is constant as temperature changes when temperature sensing diode D1 is biased from a current source providing a 70% PTAT (Proportional to Absolute Temperature) current and the combined and weighted temperature coefficients of resistors R1 and R2 in parallel connection have an approximately 30% PTAT temperature coefficient. In other embodiments, another choice for the temperature coefficient for the current source can be used as there will always be a corresponding choice of combined resistor temperature coefficients that will balance the temperature coefficient of the diode impedance. The temperature coefficient to be used for the resistors can be determined by subtracting the temperature coefficient of the current source supplying the temperature sensing diode from 100% PTAT. The resulting value is the temperature coefficient to be used for the resistors.

In FIG. 5, when switch circuit 300 is used for VBEL measurement, a resistor R3 is inserted between the drain terminal of transistor M1 and the VBEL output voltage node 340. The temperature coefficient of resistor R3 can be selected in the same manner as resistors R1 and R2 described. That is, when temperature sensing diode D1 is biased from a current source providing a 70% PTAT current, the temperature coefficient of resistor R3 is approximately 30% PTAT.

Figure 9:
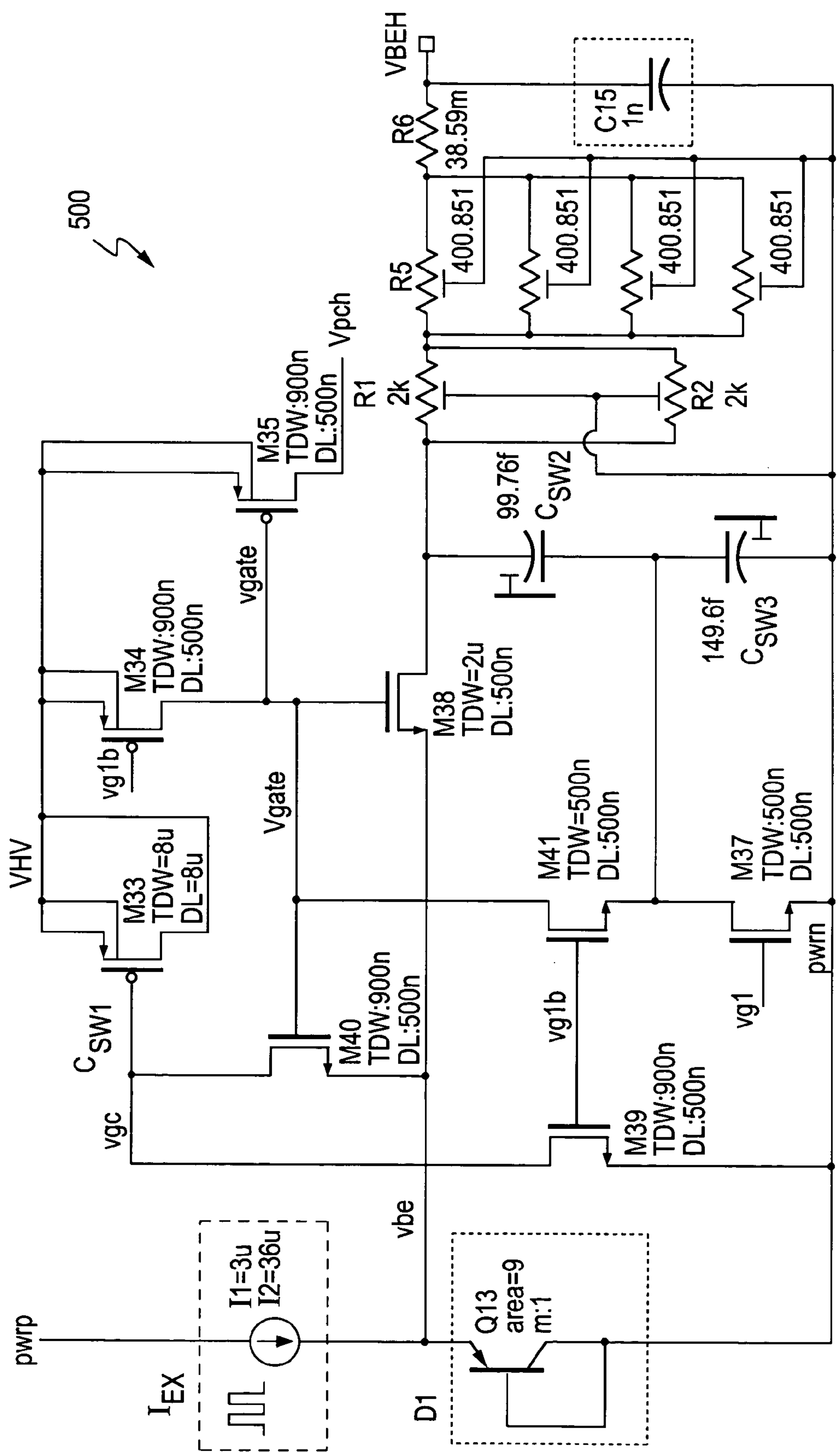
FIG. 9 is a detailed schematic diagram of a boosted switch circuit which can be used to construct switch S1 according to an alternate embodiment of the present invention.
Figure 10:
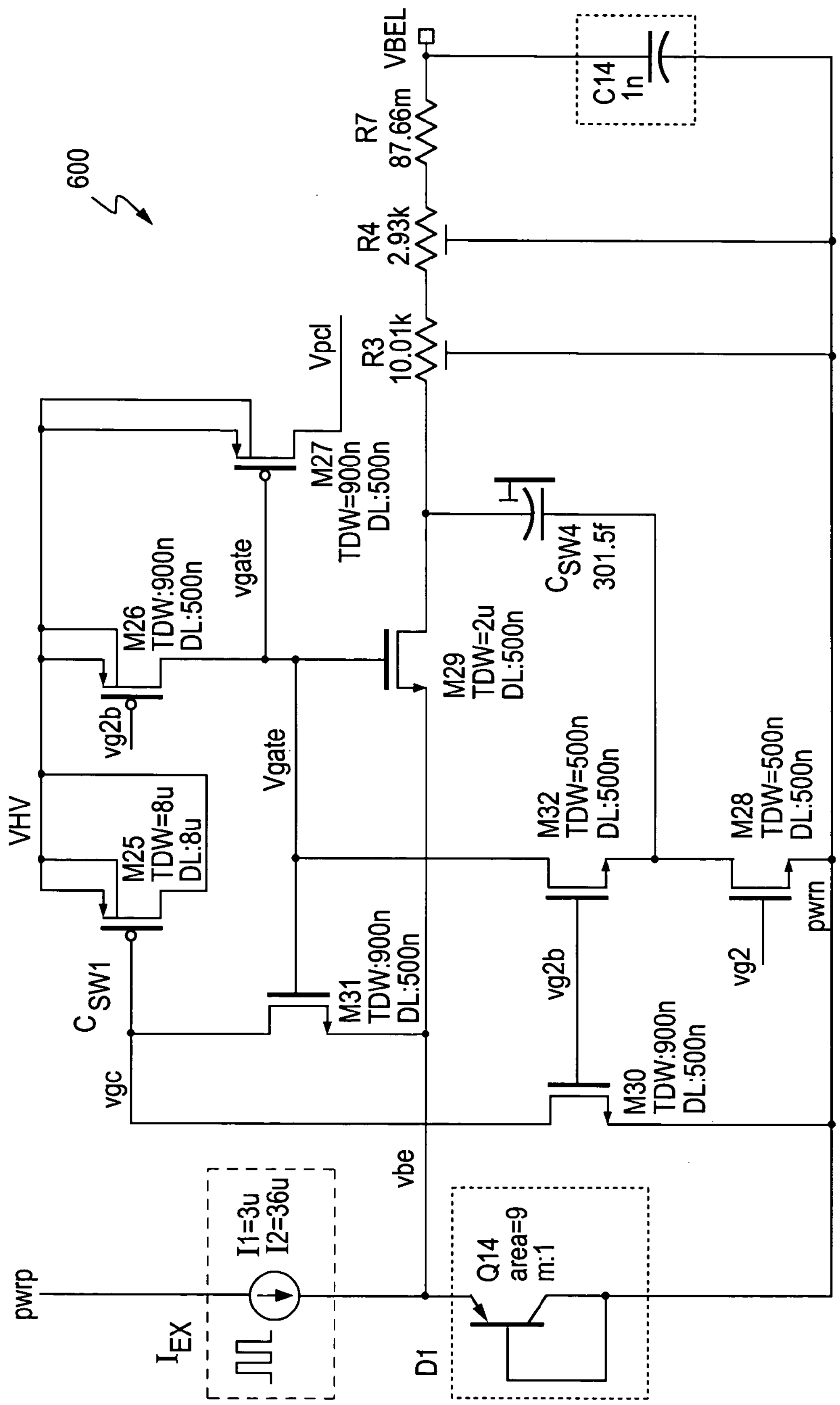
FIG. 10 is a detailed schematic diagram of a boosted switch circuit which can be used to construct switch S2 according to an alternate embodiment of the present invention.

FIG. 9 is a detailed schematic diagram of a boosted switch circuit which can be used to construct switch S1 according to an alternate embodiment of the present invention. FIG. 10 is a detailed schematic diagram of a boosted switch circuit which can be used to construct switch S2 according to an alternate embodiment of the present invention.

FIGS. 9 and 10 illustrate the detail construction of a boosted switch circuit for constructing sampling switch S1 and a boosted switch circuit for constructing sampling switch S2, respectively. The boosted switch circuits in FIGS. 9 and 10 are constructed in a similar manner to the boosted switch circuits of FIGS. 4 and 5. However, the boosted switch circuits in FIGS. 9 and 10 do not include the reset switches (SR1 to SR3) used in the boosted switch circuits of FIGS. 4 and 5. As described above, the use of the reset switches SR1 to SR3 is optional and FIGS. 9 and 10 illustrate implementations of the boosted switch circuits without the use of the reset switches. Other differences between the boosted switch circuits of FIGS. 9 and 10 and the boosted switch circuits of FIGS. 4 and 5 are noted below.

In FIGS. 9 and 10, the temperatures sensing diode D1 is implemented as a diode-connected vertical PNP bipolar transistor. Diode D1 is shown connected to a current source $I_{EX}$ to illustrate the excitation of the temperature sensing diode for generating the VBE voltage. It is understood that diode D1 and the current source $I_{EX}$ are not part of the boosted switch circuit. Furthermore, in FIGS. 9 and 10, current source $I_{EX}$ denotes a pulsed current source which is used to represent the two current sources I1 and I2 and the switches S3 and S4 used to provide the switched excitation current to diode D1. In the present illustration, current source $I_{EX}$ provides a current I1 of 3 uA and a current I2 of 36 uA.

In the embodiments shown in FIGS. 9 and 10, the precharge capacitor $C_{SW1}$ is implemented as a MOS capacitor. In other embodiments, other capacitor structure can also be used. Furthermore, in the embodiment shown in FIG. 9, capacitor $C_{SW2}$ is implemented as a polysilicon capacitor in an N-well and has a capacitance value of about 100 fF. Capacitor $C_{SW3}$ is also a polysilicon capacitor in an N-well and has a capacitance value of about 150 fF. In the embodiment shown in FIG. 10, capacitor $C_{SW4}$ is also a polysilicon capacitor in an N-well and has a capacitance value of 301 fF. In all three cases, the N-well of the polysilicon capacitor is connected to the ground potential, as illustrated by the vertical bar adjacent the capacitor symbol in FIGS. 9 and 10.

Referring to FIG. 9, switch circuit 500 includes a resistor network of resistors R1 and R2 connected in parallel. In the present embodiment, resistor R1 is a high resistive polysilicon resistor and is placed in an N-well. Such a high resistive polysilicon resistor has a negative temperature coefficient and is used to compensate other components and parameters in the switch circuit having positive temperature coefficients. Resistor R2, on the other hand, is a standard polysilicon resistor and has a positive temperature coefficient. Both resistors R1 and R2 have a resistance of around 2KΩ.

In switch circuit 500, a second set of resistors connected in parallel, denoted resistor R5, represents the ESD protection resistor. In the present illustration, the ESD protection resistor is formed using well diffusion resistors. Each of the parallel connected resistors has a resistance of 400 Ω. Thus, resistor R5 is about 100 Ω. Note that the body connections (the N-well connections) of all the resistors in R1, R2 and R5 are coupled to the ground potential.

In FIG. 9, resistor R6 is a modeling resistor representative of the metal line connecting the voltage output node of switch circuit 500 to the sampling capacitor external to the integrated circuit in which switch circuit 500 is incorporated. Resistor R6 is not intended to represent a resistor of the resistor network.

Referring to FIG. 10, switch circuit 600 includes a resistor R3 for implementing impedance matching. Resistor R3 is a high resistive polysilicon resistor and thus has a negative temperature coefficient. Resistor R3 has a resistance of about 10 kΩ. Resistor R3 is connected in series with a resistor R4 providing ESD protection. In the present illustration, resistor R4 is a well diffusion resistor and has a resistance of about 3 kΩ. In the present embodiment, when resistor R4 has a strong temperature coefficient, resistor R3 with matching reverse temperature coefficient can be used to compensate for the temperature coefficient of the ESD protection resistor. The body connections (N-well connections) of resistors R3 and R4 are coupled to the ground potential. In FIG. 10, resistor R7 is a modeling resistor representative of the metal line connecting the voltage output node of switch circuit 600 to the sampling capacitor external to the integrated circuit in which switch circuit 600 is incorporated. Resistor R7 is not intended to represent a resistor of the resistor network.

Capacitor C15 in FIG. 9 and capacitor C14 in FIG. 10 represent the capacitive load at the output terminal of the respective boosted switch circuit. Capacitors C15 and C14 are not part of the boosted switch circuits.

The parasitic capacitance effect associated with resistors R1 and R2 in switch circuit 200 and with resistor R3 in switch circuit 300 impacts the charge partitioning when the main switching device M1 is turning off. The parasitic capacitance effect can be illustrated in conjunction with the switch circuits in FIGS. 9 and 10. In switch circuit 200, each of resistors R1 and R2 includes a parasitic capacitance component. In the embodiment shown in FIG. 9, resistors R1 is implemented as a high resistive polysilicon resistor in an N-well and has a resistance of 2KΩ while resistor R2 is implemented as a standard polysilicon resistor having a resistance of 2KΩ as well. In switch circuit 300, resistor R3 also includes a parasitic capacitance component. In the embodiment shown in FIG. 10, resistor R3 is implemented as a high resistive polysilicon resistor formed in an N-well and having a resistance of 10 KΩ. As configured in FIGS. 9 and 10, resistor R3 in FIG. 10 presents a much greater parasitic capacitance than resistors R1 and R2 in FIG. 9. Therefore, in the implementation of switch circuits 300 and 600, all of the available gate channel charge collected from transistor M1 is used for charge compensation and no charge partitioning is used. On the other hand, in the implementation of switch circuits 200 and 500, the gate channel charge is partitioned for charge compensation as the parasitic capacitance associated with resistors R1 and R2 is not as high.

Figure 8:
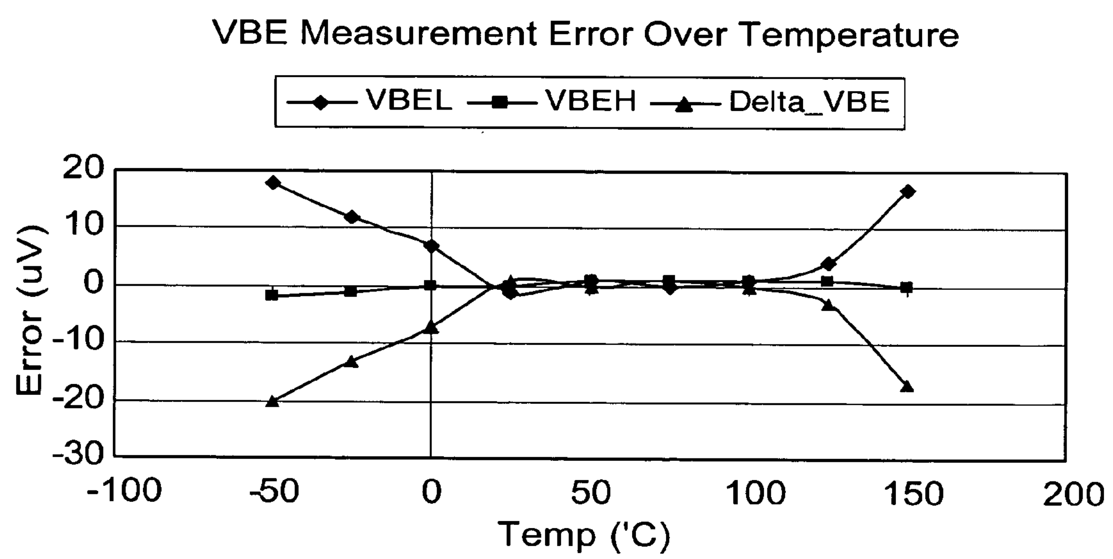
FIG. 8 is a simulation plot of the VBEH and VBEL voltages and the delta_VBE measurement errors versus temperature using the synchronized delta-VBE measurement system of the present invention.

FIG. 8 is a simulation plot of the VBEH and VBEL voltage errors and the delta_VBE measurement errors versus temperature using the synchronized delta-VBE measurement system of the present invention. As can be seen in FIG. 8, from 25 to 110 degrees Celsius, there is effectively no error whatsoever of the extracted VBEL and VBEH voltages from the ideal values. Outside of this range, there is a peak deviation of about 20 $\mu$V. When appropriate external or internal trimming is applied, there is potentially no remaining voltage error in the VBE voltage measurements.

In the boosted switch circuits of FIGS. 4, 5, 9 and 10, a reference voltage source is required to provide the precharge voltages Vpch, Vpcl and $V_A$. In accordance with the present invention, a precharge voltage circuit for generating the required precharge voltages is described. The precharge voltage circuit generates the precharge voltages Vpch, Vpcl and $V_A$ which can be used in the boost switch circuit of the present invention.

Figures 6, 7:
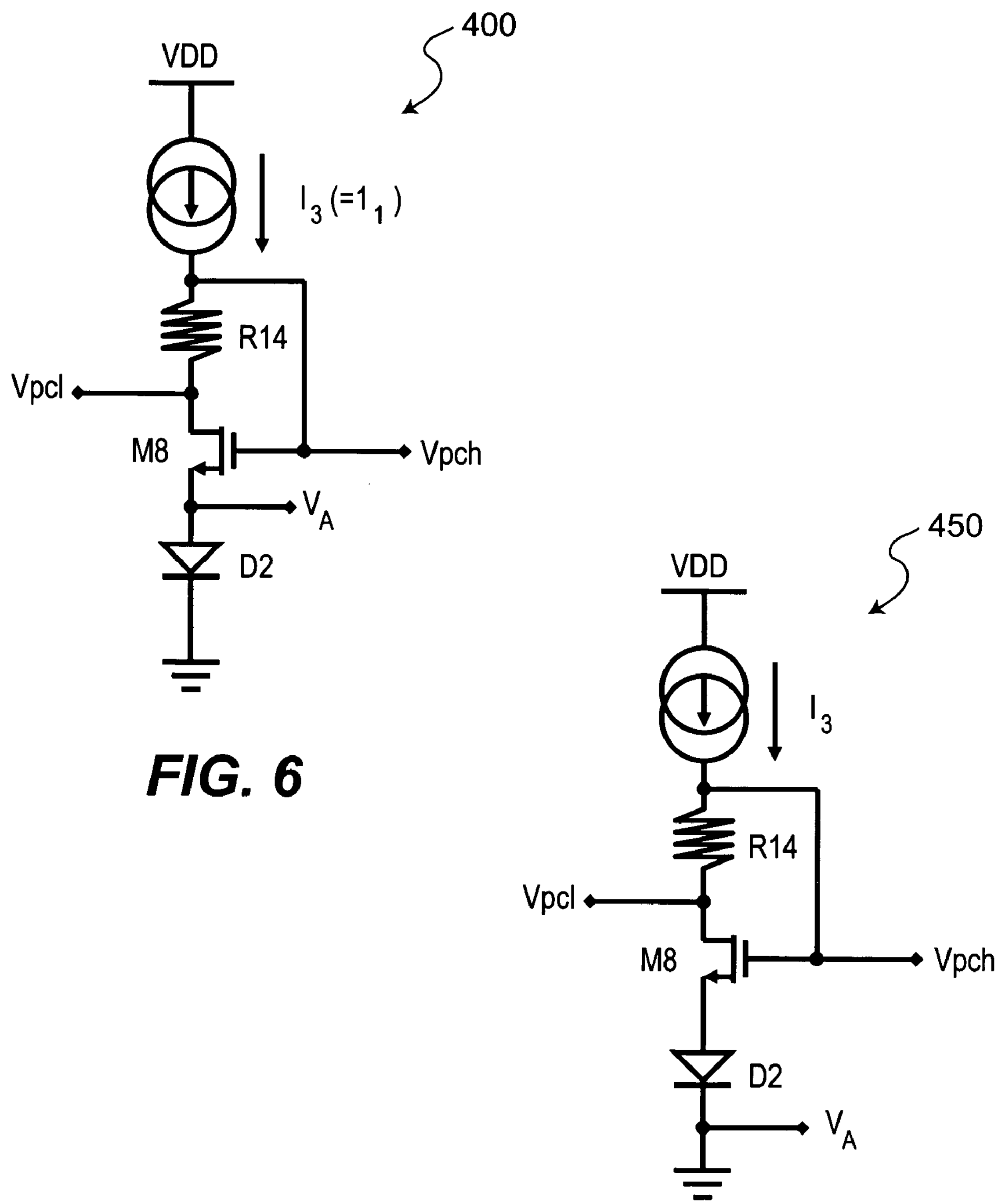
FIG. 6 is a circuit diagram of a precharge voltage circuit for generating the precharge voltages Vpch, Vpcl and $V_A$ according to one embodiment of the present invention.
FIG. 7 is a circuit diagram of a precharge voltage circuit for generating the precharge voltages Vpch, Vpcl and $V_A$ according to an alternate embodiment of the present invention.

FIG. 6 is a circuit diagram of a precharge voltage circuit for generating the precharge voltages Vpch, Vpcl and $V_A$ according to one embodiment of the present invention. FIG. 7 is a circuit diagram of a precharge voltage circuit for generating the precharge voltages Vpch, Vpcl and $V_A$ according to an alternate embodiment of the present invention.

Referring first to FIG. 6, a precharge voltage circuit 400 includes a current source providing a current I3. In the present embodiment current I3 has the same current value and temperature coefficient as current I1 of VBE generator circuit 110 of FIG. 2. Current 13 flows through a resistor R14, an NMOS transistor M8 and a diode D2. The current density J8 of transistor M8 is set by both current I3 and the width to length ratio (W/L) of transistor M8. In the present embodiment, transistor M8 has the same width and length as transistor M1 in FIG. 4 and FIG. 5. At a known current density, the gate-to-source voltage Vgs of a transistor is composed of two terms—the Vth voltage and the Vgt voltage. Voltage Vth is the effective threshold voltage of the NMOS transistor M8, including body effect because transistor M8's source potential is not at the ground voltage but rather is connected to the anode of diode D2. The source terminal of transistor M8 is thus at the VBE voltage and more specifically, at the VBEL voltage as current I3 is equal to current I1 for generating the VBEL voltage. In this manner, transistor M8 is connected in a manner similar to the main switching device (transistor M1) of the boosted switch circuit. That is, the source terminal of transistor M1 is also connected to the anode of diode D1 for receiving the VBE voltage.

Since the main switching device of the boosted switch itself is operating at a source and drain voltage of VBEH or VBEL when the switch is turned on, the threshold voltage of the main switching device in the boosted switch circuit is subject to the same body effect shift as transistor M8. Thus, transistor M8 will have the same effective Vth voltage as transistor M1 in the boosted switch circuit. This means that the gate-to-source voltage of transistor M8 (Vgs8) if applied to transistor M1's gate and source accurately, can program transistor M1 with the same Vgt voltage, independent of any other factor.

For biasing the switch circuit used for VBEH measurement, the gate voltage of transistor M8 is taken as the precharge voltage Vpch and the source voltage of M8 is taken as the voltage $V_A$. When the precharge capacitor $C_{SW1}$, precharged with the Vpch-$V_A$ voltage is applied across transistor M1 of the switch circuit, the gate-to-source voltage of transistor M8 (i.e., the Vpch-$V_A$ voltage) is applied across the gate and source terminal of transistor M1. For biasing the switch circuit used for VBEL measurement, the drain voltage of transistor M8 is taken as the precharge voltage Vpcl. When the precharge capacitor $C_{SW1}$, precharged with the Vpcl-$V_A$ voltage is applied across transistor M1 of the switch circuit, the drain-to-source voltage of transistor M8 (i.e., the Vpcl-$V_A$ voltage) is applied across the gate and source terminal of transistor M1. Note that because the drain terminal of transistor M8 is connected to the gate terminal through resistor R14, the drain-to-source voltage of transistor M8 has the same behavior as the gate-to-source voltage Vgs8 of the transistor.

Applying the Vgs8 voltage to the gate-to-source voltage of transistor M1 forces transistor M1 to a known on-resistance (Ron) state, and this Ron value will not change with process or signal state, which is highly desirable. Such a minimization of Ron variance also minimizes changes in the injected charge Qinj. In this manner, two critical factors that most directly affect the accuracy of the boosted switch, Ron and Qinj, are tightly controlled, lending accuracy to the off-chip measurement of VBEH and VBEL, and therefore $\Delta V_{BE}$.

In FIG. 6, transistor M8 is designed to have the same current density that would result in a known constant Ron. The difference between Vpch or Vpcl and VA—the voltage difference when applied to the gate and source terminals of transistor M1, through the use of the precharge capacitor $C_{SW1}$—should be exactly the right amount of voltage to fix Ron constant at its desired minimized value.

Referring to FIG. 7, a second embodiment of the precharge voltage circuit is shown. The precharge voltage circuit 450 is constructed in the same manner as precharge voltage circuit 400 of FIG. 6 except for the voltage $V_A$ terminal. In the present embodiment, the reference voltage $V_A$ for the bottom plate of the precharging capacitor is taken as the ground voltage. Using the ground voltage as voltage $V_A$ has the effect of adding a voltage, VBE2 of diode D2, to the voltage applied to transistor M1's gate to source terminals in the boosted switch circuit. Thus, the new gate-tosource voltage Vgs1 of transistor M1 is equal to Vth8+Vgt8+VBE2. Since Vth8= Vth1, as described before, Vgt1 becomes Vgt8+VBE2.

By adding the VBE2 voltage of diode D2 to the Vgs voltage of transistor M1, an over-boost voltage is provided to lower the impedance of transistor M1's on-resistance below that of the case when the first embodiment in FIG. 6 is used. The over-boost voltage would make transistor M1's Ron as a function of temperature be reduced the least at high temperatures and reduced the most at cold temperatures, producing a Ron that has a positive slope versus temperature. Note that the impedance of a bipolar diode biased at sub-PTAT current increases over temperature linearly. By having Ron (T) behave like Rd (T) (where Rd is the resistance of the diode D2), the matching temperature behavior can be exploited to match impedances over temperature. The over-boost voltage is another means for optimizing the boosted switch when used to measure the VBE voltages.

In both precharge voltage circuits 400 and 450 in FIGS. 6 and 7, a resistor R14 is included in series with the current source I3 and transistor M8. By passing current I3 through another resistor R14 having the appropriate temperature coefficient, the voltage drop across resistor R14 can be restored to 100% PTAT. Thus, (Vpch-Vpcl) will be 100% PTAT, just like a delta_VBE voltage. In fact, by choosing the absolute value of resistor R14 correctly, voltage Vpcl will equal Vgt8+VBEL, which is ideal for biasing the Vgt voltage of transistor M1 in FIG. 5.

The above detailed descriptions are provided to illustrate specific embodiments of the present invention and are not intended to be limiting. Numerous modifications and variations within the scope of the present invention are possible.

We claim:

1. A circuit in an integrated circuit for measuring temperature dependent voltages of a temperature sensing element incorporated in the integrated circuit, the circuit comprising:

a voltage generator circuit comprising:

a first current source providing a first current;

a second current source providing a second current, the first current and the second current having a fixed ratio;

a temperature sensing element;

a first current switch coupling the second current source to the temperature sensing element;

a second current switch coupling the first current source to the temperature sensing element, wherein the first current switch and the second current switch are alternately asserted to alternately apply the first current and the second current to the temperature sensing element to generate the temperature dependent voltages;

a first sampling switch coupling the voltage at the temperature sensing element to a first node, the first sampling switch comprising a self-bootstrapping constant on-resistance boosted switch circuit incorporating a pedestal voltage compensation circuit; and a second sampling switch coupling the voltage at the temperature sensing element to a second node, the second sampling switch comprising a self-bootstrapping constant on-resistance boosted switch circuit incorporating a pedestal voltage compensation circuit, wherein the first sampling switch samples the temperature dependent voltage of the temperature sensing element when the temperature sensing element is being excited by the second current and provides a first voltage indicative of the sampled voltage at the first node, and the second sampling switch samples the temperature dependent voltage of the temperature sensing element when the temperature sensing element is being excited by the first current and provides a second voltage indicative of the sampled voltage at the second node, whereby a difference between the first voltage and the second voltage is used to determine the temperature of the integrated circuit.

2. The circuit of claim 1, wherein the first voltage is coupled to a first capacitor external to the integrated circuit and the second voltage is coupled to a second capacitor external to the integrated circuit so that the first capacitor is charged through the first sampling switch to the first voltage when the temperature sensing element is being excited by the second current and the second capacitor is charged through the second sampling switch to the second voltage when the temperature sensing element is being excited by the first current.

3. The circuit of claim 2, wherein a voltage measurement device external to the integrated circuit is coupled to the first capacitor and the second capacitor for measuring a difference between the first voltage and the second voltage, the difference being indicative of the temperature of the integrated circuit.

4. The circuit of claim 2, wherein the first current switch is controlled by a first clock signal for closing the switch during a first clock period and the second current switch is controlled by a second clock signal for closing the switch during a second clock period, and wherein the first sampling switch is enabled during the first clock period to charge the first capacitor and the second sampling switch is enabled during the second clock period to charge the second capacitor.

5. The circuit of claim 4, wherein the first clock period and the second clock period are repeatedly applied to repeatedly excite the temperature sensing element, and the first sampling switch and the second sampling switch are accordingly repeatedly enabled to charge the first capacitor and the second capacitor.

6. The circuit of claim 2, wherein the second capacitor has a smaller capacitance value than the first capacitor.

7. The circuit of claim 1, wherein the second current is m times the first current where m comprises an integer or a fractional number.

8. The circuit of claim 1, wherein the temperature sensing element is a diode-connected bipolar transistor.

9. The circuit of claim 8, wherein the temperature of the integrated circuit is determined by $T=(\Delta V_{BE}*q)/(nf*k*\ln(I2/I1))$, where $\Delta V_{BE}$ is the difference between the first voltage and the second voltage, q is the electronic charge, k is the Boltzmann's constant, nf is the emission coefficient, I1 is the current value of the first current and I2 is the current value of the second current.

10. The circuit of claim 3, wherein the integrated circuit comprises a temperature sensor, the integrated circuit including sensor circuitry for receiving the temperature dependent voltages at the temperature sensing element and generating a temperature output signal, and wherein the difference between the first voltage and the second voltage is used to determine a first temperature of the integrated circuit and the first temperature is compared with a second temperature generated by the temperature sensor as the temperature output signal, the difference between the first temperature and the second temperature being used to calibrate the temperature sensor.

11. The circuit of claim 1, wherein the first sampling switch and the second sampling switch each comprises a boosted switch circuit, the boosted switch circuit comprising an input terminal coupled to the temperature sensing element and an output terminal coupled to the respective first or second node, the boosted switch circuit comprising:

a switching device having an input node coupled to the input terminal and an output node coupled to the output terminal, the switching device having a control terminal;

a charge storage device having a first terminal and a second terminal;

a first switch coupled to the control terminal of the switching device, the first switch having a first position coupled to a third node and a second position being an open circuit;

a second switch coupled to the first terminal of the charge storage device, the second switch having a first position coupled to a first reference voltage and a second position coupled to the control terminal of the switching device;

a third switch coupled to the second terminal of the charge storage device, the third switch having a first position coupled to a second reference voltage and a second position coupled to the input terminal; and a pedestal voltage compensation circuit providing a compensating charge to the output terminal, the compensating charge being derived from a channel charge originated from the control terminal of the switching device when the switching device is turned off, wherein the first, second and third switches are in the first positions for turning off the boosted switch circuit when a first clock signal is deasserted and the first, second and third switches are in the second positions for turning on the boosted switch circuit when the first clock signal is asserted, and wherein the pedestal voltage compensation circuit provides the compensating charge to the output terminal when the boosted switch circuit is turned off.

12. The circuit of claim 11, wherein the pedestal voltage compensation circuit in the boosted switch circuit comprises:

a fourth switch coupled between the third node and a first supply voltage, the fourth switch having a first position being an open circuit and a second position coupling the third node to the first supply voltage; and a capacitor divider circuit coupled between the output terminal and the first supply voltage, a common node of the capacitor divider circuit being coupled to the third node, wherein the fourth switch is in the first position when the first sampling switch is turned off and the capacitor divider circuit generates a compensating charge at the output terminal based on the channel charge originated from the control terminal of the switching device when the boosted switch circuit is turned off.

13. The circuit of claim 12, wherein the fourth switch in the pedestal voltage compensation circuit comprises:

a fifth NMOS transistor having a first current handling terminal coupled to the third node, a second current handling terminal coupled to the first supply voltage, and a gate terminal driven by the first clock signal.

14. The circuit of claim 12, wherein the capacitor divider circuit in the pedestal voltage compensation circuit comprises a first capacitor and a second capacitor connected in series between the output terminal and the first supply voltage, the common node of the first and second capacitors being the third node, the first and second capacitors dividing the channel charge from the control terminal of the switching device to generate the compensating charge.

15. The circuit of claim 14, wherein the first capacitor and the second capacitor has equal capacitance.

16. The circuit of claim 12, wherein the capacitor divider circuit in the pedestal voltage compensation circuit comprises a single capacitor connected between the output terminal and the third node, the single capacitor receiving and redirecting the entirety of the channel charge from the control terminal of the switching device as the compensating charge.

17. The circuit of claim 11, wherein the switching device in the boosted switch circuit comprises an NMOS transistor.

18. The circuit of claim 11, wherein the charge storage device in the boosted switch circuit is charged to a voltage value being the difference between the first precharge voltage and the second precharge voltage when said second and third switches are in the first positions.

19. The circuit of claim 11, wherein the first supply voltage is a ground voltage.

20. The circuit of claim 11, wherein the charge storage device in the boosted switch circuit comprises a MOS capacitor.

21. The circuit of claim 11, wherein the switching device in the boosted switch circuit comprises a first NMOS transistor having a first current handling terminal coupled to the input terminal, a second current handling terminal coupled to the output terminal, and a gate terminal being the control terminal of said switching device.

22. The circuit of claim 21, wherein the first switch comprises a second NMOS transistor having a first current handling terminal coupled to the gate terminal of the first NMOS transistor, a second current handling terminal coupled to the third node, and a gate terminal driven by an inverse of the first clock signal.

23. The circuit of claim 21, wherein the second switch in the boosted switch circuit comprises:

a first PMOS transistor having a first current handling terminal coupled to the first reference voltage, a second current handling terminal coupled to the first terminal of the charge storage device, and a gate terminal connected to the gate terminal of the first NMOS transistor; and a second PMOS transistor having a first current handling terminal coupled to the gate terminal of the first NMOS transistor, a second current handling terminal coupled to the first terminal of the charge storage device, and a gate terminal driven by an inverse of the first clock signal.

24. The circuit of claim 21, wherein the third switch in the boosted switch circuit comprises:

a third NMOS transistor having a first current handling terminal coupled to the second terminal of the charge storage device, a second current handling terminal coupled to the second reference voltage, and a gate terminal driven by an inverse of the first clock signal; and a fourth NMOS transistor having a first current handling terminal coupled to the input terminal, a second current handling terminal coupled to the first current handling terminal of the third NMOS transistor, and a gate terminal coupled to the gate terminal of the first NMOS transistor.

25. The circuit of claim 11, wherein the boosted switch circuit further comprises a resistor network coupled between the output node of the switching device and the output terminal, the resistor network having an impedance value for matching the impedance value at the input terminal of the boosted switch circuit and having a temperature coefficient selected to maintain the impedance matching over the desired temperature range.

26. The circuit of claim 11, wherein the boosted switch circuit further comprises a precharge voltage circuit for generating the first reference voltage and the second reference voltage, the precharge voltage circuit comprising:

a third current source providing a third current, the third current having the same magnitude as the first current;

a first resistor having a first terminal coupled to the third current source and a second terminal;

a sixth NMOS transistor having a first current handling terminal coupled to the second terminal of the first resistor, a second current handling terminal and a control terminal coupled to the first terminal of the first resistor; and a temperature sensing element coupled between the second current handling terminal and the first supply voltage, wherein when the boosted switch circuit is used to implement the first sampling switch, the control terminal of the sixth NMOS transistor provides the first reference voltage and the second current handling terminal of the sixth NMOS transistor provides the second reference voltage; and wherein when the boosted switch circuit is used to implement the second sampling switch, the first current handling terminal of the sixth NMOS transistor provides the first reference voltage and the second current handling terminal of the sixth NMOS transistor provides the second reference voltage.

27. The circuit of claim 11, wherein the boosted switch circuit further comprises a precharge voltage circuit for generating the first reference voltage and the second reference voltage, the precharge voltage circuit comprising:

a third current source providing a third current, the third current having the same magnitude as the first current;

a first resistor having a first terminal coupled to the third current source and a second terminal;

a sixth NMOS transistor having a first current handling terminal coupled to the second terminal of the first resistor, a second current handling terminal and a control terminal coupled to the first terminal of the first resistor; and a temperature sensing element coupled between the second current handling terminal and the first supply voltage, wherein when the boosted switch circuit is used to implement the first sampling switch, the control terminal of the sixth NMOS transistor provides the first reference voltage and the second reference voltage comprises the first supply voltage; and wherein when the boosted switch circuit is used to implement the second sampling switch, the first current handling terminal of the sixth NMOS transistor provides the first reference voltage and the second reference voltage comprises the first supply voltage.

* * * * *